US009740320B2

(12) United States Patent
Yang et al.

(10) Patent No.: US 9,740,320 B2
(45) Date of Patent: Aug. 22, 2017

(54) PIXEL CIRCUIT AND DISPLAY APPARATUS (71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Haisheng Wang, Beijing (CN); Yingming Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 38 days.

(21) Appl. No.: 14/443,433

(22) PCT Filed: Sep. 22, 2014

(86) PCT No.: PCT/CN2014/087019
§ 371 (c)(1),
(2) Date: May 18, 2015

(87) PCT Pub. No.: WO2015/180317
PCT Pub. Date: Dec. 3, 2015

(65) Prior Publication Data
US 2016/0253011 A1  Sep. 1, 2016

(30) Foreign Application Priority Data

May 26, 2014 (CN) .......................... 2014 1 0225975

(51) Int. Cl.
*G06F 3/041* (2006.01)
*G09G 3/32* (2016.01)
(Continued)

(52) U.S. Cl.
CPC ............ *G06F 3/0412* (2013.01); *G06F 3/041* (2013.01); *G06F 3/0416* (2013.01); *G09G 3/32* (2013.01);
(Continued)

(58) Field of Classification Search
CPC . G02F 1/13338; G06F 3/0412; H01L 27/323; G09G 3/30; G09G 3/36
See application file for complete search history.

(56) References Cited

U.S. PATENT DOCUMENTS

2004/0100203 A1  5/2004  Kobayashi et al.
2008/0150848 A1  6/2008  Chung et al.
(Continued)

FOREIGN PATENT DOCUMENTS

CN    1417631 A    5/2003
CN    1606769 A    4/2005
(Continued)

OTHER PUBLICATIONS

CN103456267_EnglishLanguageTranslation; Published Dec. 2013; Author: Shengji Yang.*
(Continued)

*Primary Examiner* — Nalini Mummalaneni
(74) *Attorney, Agent, or Firm* — Banner & Witcoff, Ltd.

(57) ABSTRACT

Disclosed are a pixel circuit and a display apparatus. The pixel circuit comprises a pixel compensation module, a light emitting module and a touch detection module; the pixel compensation module is connected to a first to a fourth scan signal lines (Scan[1], Scan[2], Scan[3], Em), a first operation voltage (Vdd), a data voltage (Vdata) and the light emitting module respectively, and is configured to control the light emitting module to emit light for display in accordance with inputs from the scan signal lines; the touch detection module comprises a detection sub module and an
(Continued)

output sub module. The pixel compensation module and the touch detection module are integrated into the pixel circuit, and the pixel compensation module and the touch detection module share the data voltage (Vdata) and the scan signal line in common.

18 Claims, 9 Drawing Sheets

(51) Int. Cl.
*G09G 3/3233* (2016.01)
*G09G 3/3258* (2016.01)
*H01L 27/32* (2006.01)
*H01L 27/12* (2006.01)

(52) U.S. Cl.
CPC ......... *G09G 3/3233* (2013.01); *G09G 3/3258* (2013.01); *H01L 27/323* (2013.01); *H01L 27/3262* (2013.01); *H01L 27/3265* (2013.01); *H01L 27/3276* (2013.01); *G09G 2300/0426* (2013.01); *G09G 2300/0819* (2013.01); *G09G 2300/0861* (2013.01); *G09G 2320/043* (2013.01); *G09G 2354/00* (2013.01); *H01L 27/124* (2013.01); *H01L 27/1255* (2013.01)

(56) References Cited

U.S. PATENT DOCUMENTS

| | | | |
|---|---|---|---|
| 2008/0225061 A1* | 9/2008 | Kimura | ............... H01L 27/1255 345/690 |
| 2009/0115735 A1 | 5/2009 | Chuang | |
| 2010/0141595 A1 | 6/2010 | Lai et al. | |
| 2011/0007003 A1 | 1/2011 | Jang et al. | |
| 2011/0090194 A1 | 4/2011 | Chang et al. | |

FOREIGN PATENT DOCUMENTS

| | | | | |
|---|---|---|---|---|
| CN | 101217021 A | | 7/2008 | |
| CN | 101937282 A | | 1/2011 | |
| CN | 103295525 A | | 9/2013 | |
| CN | 103310734 A | | 9/2013 | |
| CN | 103325343 A | | 9/2013 | |
| CN | 103456267 A | * | 12/2013 | ........... G06F 3/0412 |
| CN | 103996377 A | | 8/2014 | |
| CN | 104036723 A | | 9/2014 | |

OTHER PUBLICATIONS

Oct. 10, 2015—(CN) First Office Action Appn 201410225975.4 with English Tran.
Feb. 27, 2015—(PCT) Written Opinion of the International Searching Authority—App. PCT/CN2014/087019—Eng. Tran.

* cited by examiner

PIXEL CIRCUIT AND DISPLAY APPARATUS

The application is a U.S. National Phase Entry of International Application No. PCT/CN2014/087019 filed on Sept. 22, 2014, designating the United States of America and claiming priority to Chinese Patent Application No. 201410225975.4 filed on May 26, 2014. The present application claims priority to and the benefit of the above-identified applications and the above-identified applications are incorporated by reference herein in their entirety.

TECHNICAL FIELD OF THE DISCLOSURE

The present disclosure relates to a pixel circuit and a display apparatus.

BACKGROUND

With a fast development of the display technology, a display apparatus with a touch function has been increasingly popular among people due to its advantages such as a visualized operation or the like. Generally, according to a difference in a relative location between a touch panel and a display panel, the current display apparatuses with the touch function may be divided into two types, the on-cell touch panel and the in-cell touch panel. Compared with the on-cell touch panel, the in-cell touch panel has a thinner thickness and a higher light transmittance.

For the current display apparatus, an Organic Light Emitting Diode (OLED for short), as a current type light emitting device, has been applied in the field of high performance display, due to its characteristic such as self Emitting, quick response, wide view angle and being capable of being formed on a flexible substrate. The OLED display apparatus can be divided into a Passive Matrix Driving OLED (PMOLED for short) and an Active Matrix Driving OLED (AMOLED for short) according to a difference in driving manners. Since the AMOLED display has advantages such as low manufacture cost, quick response speed, power saving, direct current driving applicable to a portable device, wide operation temperature range, or the like, it is expected to become the next generation new flat display, replacing the Liquid Crystal Display (LCD for short). Therefore, the AMOLED display panel with the in-cell touch function has been increasingly popular among people.

In the current AMOLED display panel, each OLED emits light for display by being driven by a driving circuit formed of multiple Thin Film Transistor (TFT for short) switches in one pixel cell on an array substrate.

An in-cell Touch Screen Panel (TSP for short) forms a sensor for touch and a driving circuit into each pixel unit on the array substrate with the same array process. If the sensor and the driving circuit of the TSP are to be overlaid into the AMOLED pixel unit, it requires to add a certain number of driving circuit TFTs, thereby requiring to occupy the room for a certain number of pixel units additionally. However, the spare room in the pixel unit is limited, which limits the simultaneous manufacture of the in-cell touch panel circuit and the AMOLED driving circuit.

SUMMARY

A pixel circuit and a display apparatus are provided in at least one embodiment of the present disclosure, which can improve the integration degree of the in-cell touch circuit and the pixel driving circuit.

A pixel circuit is provided in at least an embodiment of the present disclosure, comprising a pixel compensation module, a light emitting module and a touch detection module;

the pixel compensation module is connected to a first to a fourth scan signal lines, a first operation voltage, a data voltage and the light emitting module respectively, and is configured to control the light emitting module to emit light for display in accordance with inputs from the scan signal lines;

the touch detection module comprises a detection sub module and an output sub module, wherein the detection sub module is connected to the second scan signal line, a second operation voltage and the data voltage respectively, and is configured to detect a touch signal; the output sub module is connected to the third scan signal line, a touch signal read line and the detection sub module, and is configured to output a touch detection signal to the touch signal read line in accordance with an input from the third scan signal line.

Alternatively, the light emitting module comprises an electroluminescent element connected to the pixel compensation module.

Alternatively, the pixel compensation module comprises a first to a sixth switch units, a pixel driving unit and an energy storage unit; and wherein the first switch unit is connected between the first operation voltage and an input terminal of the pixel driving unit, and a control terminal the first switch unit is connected to the fourth scan signal line;

the second switch unit is connected to the energy storage unit and the fifth switch unit in cascade sequentially, wherein one terminal of the second switch unit is grounded and the other terminal of the second switch unit is connected to a first terminal of the energy storage unit; one terminal of the fifth switch unit is connected to a second terminal of the energy storage unit and the other terminal of the fifth switch unit is connected to an output terminal of the pixel driving unit, and control terminals of the second switch unit and the fifth switch units are both connected to the third scan signal line;

the third switch unit is connected between the first terminal of the energy storage unit and the data voltage, the sixth switch unit is connected between the output terminal of the pixel driving unit and the electroluminescent element, and control terminals of the third switch unit and the sixth switch unit are both connected to the first scan signal line;

one terminal of the fourth switch unit is connected to the second terminal of the energy storage unit, the other terminal of the fourth switch unit is grounded and a control terminal of the fourth switch unit is connected to the second scan signal line;

a control terminal of the pixel driving unit is further connected to the second terminal of the energy storage unit.

Alternatively, the energy storage unit is a capacitor.

Alternatively, the output sub module comprises a seventh switch unit, one terminal of the seventh switch unit is connected to the touch signal read line, the other terminal of the seventh switch unit is connected to the detection sub module and a control terminal of the seventh switch unit is connected to the third scan signal line.

Alternatively, the detection sub module comprises an eighth switch unit, a touch signal driving unit, a sensing capacitor and a touch electrode, the eighth switch unit is connected between a control terminal of the touch signal driving unit and the data voltage, a control terminal of the eighth switch unit is connected to the second scan signal line; an input terminal of the touch signal driving unit is connected to the second operation voltage and an output terminal of the touch signal driving unit is connected to the seventh switch unit; the sensing capacitor is connected between the input terminal and the control terminal of the touch signal driving unit, and the touch electrode is connected to the control terminal of the touch signal driving unit.

Alternatively, the third scan signal line to which the output sub module is connected is replaced with the first scan signal line, and the third scan signal line to which the control terminal of the seventh switch unit is connected is replaced with the first scan signal line.

Alternatively, the second scan signal line to which a control terminal of the detection sub module is connected is replaced with the third scan signal line, and the second scan signal line to which the control terminal of the eighth switch unit is connected is replaced with the third scan signal line.

Alternatively, the respective switch units and driving units are thin film transistors (TFTs).

Alternatively, the respective thin film transistors are P-channel type transistors, the control terminals of the driving units are gates of the TFTs, the input terminals of the driving units are sources of the TFTs and output terminals of the driving units are drains of the TFTs; the control terminals of the respective switch units are gates of the TFTs and the other two terminals of the respective switch units correspond to sources and drains of the TFTs.

A display apparatus comprising pixel circuits of any one described above is further provided in at least one embodiment of the present disclosure, In the pixel circuit and the display apparatus provided in the present disclosure, the pixel compensation module and the touch detection module are integrated into the pixel circuit, and the pixel compensation module and the touch detection module share the data voltage and the scan signal line. In this way, the number of signal lines can be decreased, thereby the pitch of pixels is largely decreased and IC cost is reduced, achieving a higher pixel density.

BRIEF DESCRIPTION OF THE DRAWINGS

FIG. 3 is a time sequence diagram of key signals in a driving method for the pixel circuit shown in FIG. 2a;

FIGS. 4a-4d are schematic diagrams showing current flow directions and voltage values in different timings of the pixel circuit shown in FIG. 2a.

DETAILED DESCRIPTION

Hereinafter, the particular embodiments of the present disclosure will be further described with reference to the accompany drawings and the embodiments. The following embodiments are only for description of the technical solutions of the present disclosure more clearly, and are not for limitation of the protection scope of the present disclosure. In the accompany drawings, the same elements are represented by the same reference numerals.

Figure 1:
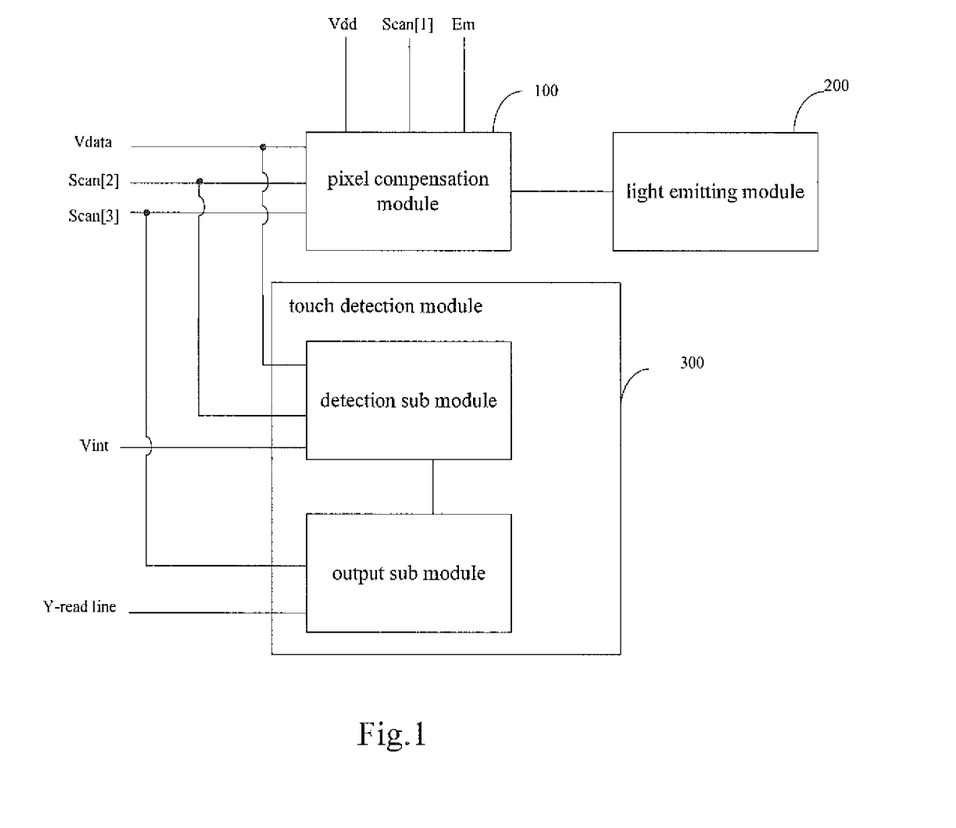
FIG. 1 is a schematic diagram showing a structure of a pixel circuit provided in an embodiment of the present disclosure.

FIG. 1 is a schematic diagram showing a structure of a pixel circuit provided in an embodiment of the present disclosure. As shown in FIG. 1, the pixel circuit comprises a pixel compensation module 100, a light emitting module 200 and a touch detection module 300.

The pixel compensation module 100 is connected to a first to a fourth scan signal lines (Scan[1], Scan[2], Scan[3] and Em in order, as shown in the figure), a first operation voltage Vdd, a data voltage Vdata and the light emitting module 200 respectively, and is configured to control the light emitting module 200 to emit light for display in accordance with inputs from the scan signal lines.

The touch detection module 300 comprises a detection sub module and an output sub module, wherein the detection sub module 310 is connected to the second scan signal line Scan[2], a second operation voltage Vint and a data voltage Vdata respectively, and is configured to detect a touch signal; the output sub module 320 is connected to the third scan signal line Scan[3], a touch signal read line (Y-read Line) and the detection sub module 310, and is configured to output a touch detection signal to the Y-read Line in accordance with an input from the third scan signal line Scan[3].

In the pixel circuit provided in the present disclosure, the pixel compensation module and the touch detection module are integrated into the pixel circuit, and the pixel compensation module and the touch detection module share the data voltage and the scan signal line. In this way, the number of signal lines can be decreased, thereby the pitch of pixels is largely decreased and IC cost is reduced, achieving a higher pixel density.

Here, the second operation voltage Vint is used to provide a driving pulse.

Figure 2A:
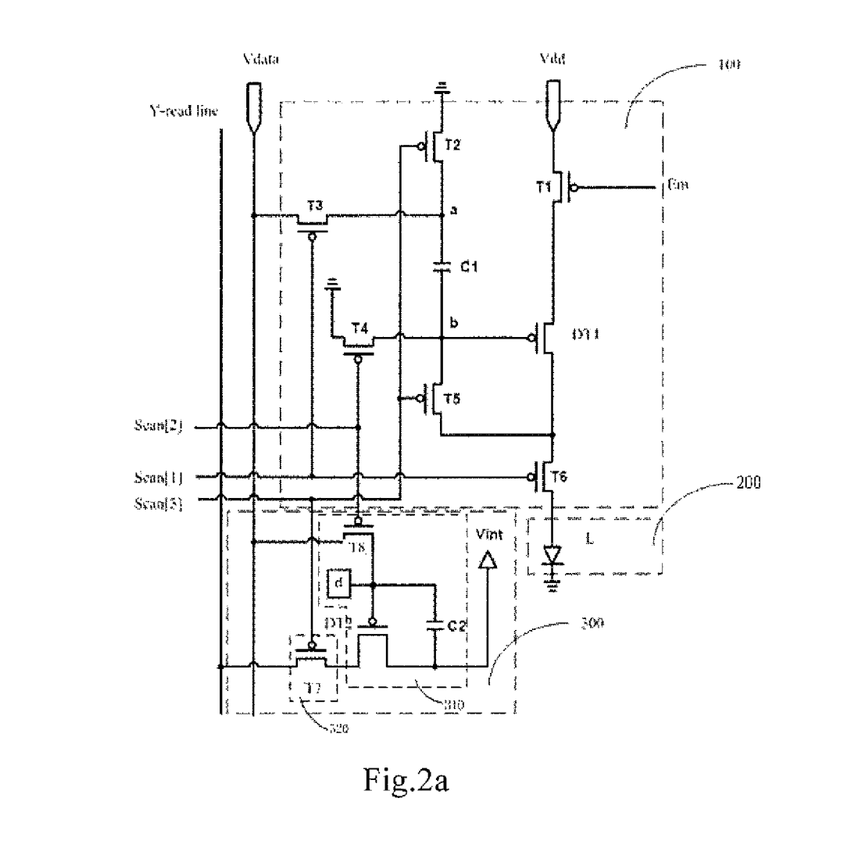
FIGS. 2a-2c are schematic diagrams showing circuit structures of the pixel circuits provided in embodiments of the present disclosure.
Figure 2B:
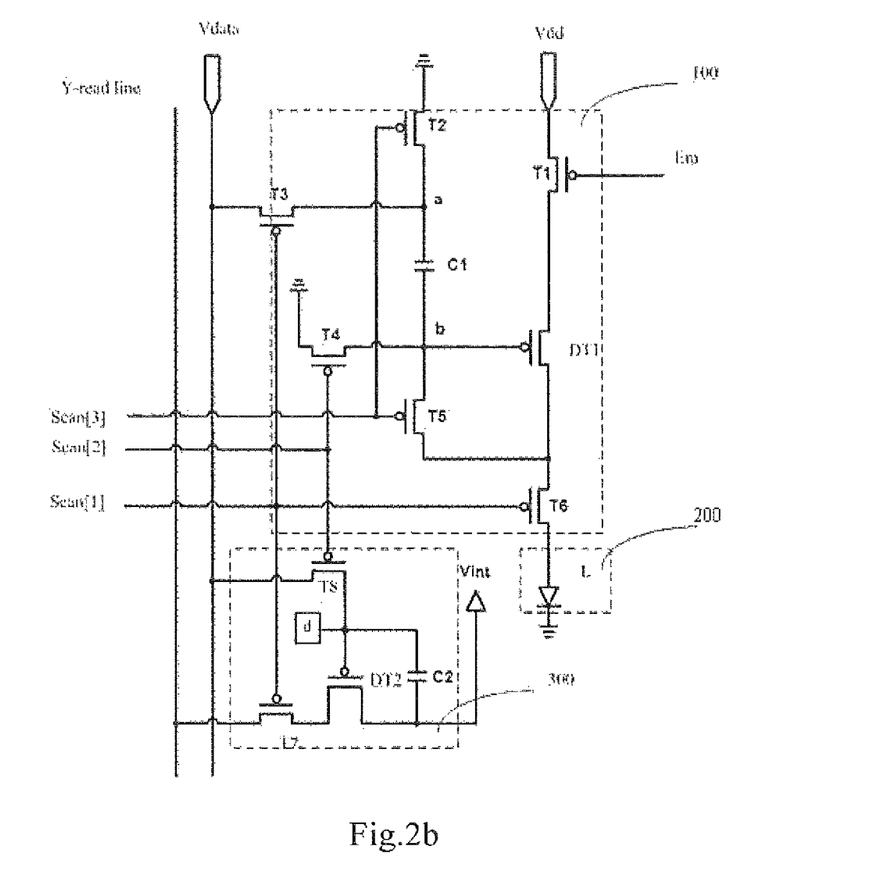
Figure 2C:
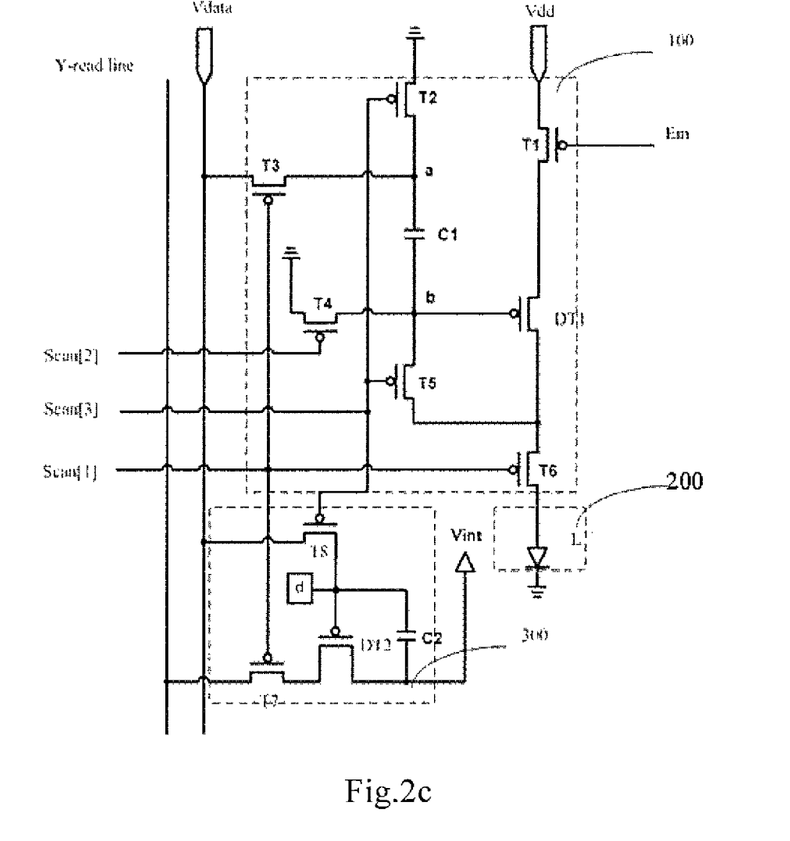

FIGS. 2a-2c are schematic diagrams showing circuit structures of the pixel circuits provided in embodiments of the present disclosure. As shown in FIGS. 2a-2c, the light emitting module 200 may comprise an electroluminescent element L connected to the pixel compensation module 100.

In the embodiments of the present disclosure, the light emitting device L may be various current driven light emitting device in the known solutions, such as the Light Emitting Diode (LED for short) or the Organic Light Emitting Diode (OLED for short), or the like. In the embodiment of the presents disclosure, the description will be made taking OLED as an example.

Further, as shown in FIGS. 2a-2c, the pixel compensation module 100 comprises a first to a sixth switch units (T1, T2, . . . , T6 in order, as shown in FIGS. 2a-2c), a pixel driving unit DT1 and an energy storage unit C1.

The first switch unit T1 is connected between Vdd and an input terminal of the pixel driving unit DT1, a control terminal of the first switch unit is connected to the fourth scan signal line Em.

The second switch unit T2 is connected to the energy storage unit C1 and the fifth switch unit T5 in cascade sequentially, wherein one terminal of the second switch unit T2 is grounded and the other terminal of the second switch unit T2 is connected to a first terminal a of the energy storage unit C1, one terminal of the fifth switch unit T5 is connected to a second terminal b of the energy storage unit C1 and the other terminal of the fifth switch unit T5 is connected to an output terminal of the pixel driving unit DT1, and control terminals of the second switch unit T2 and the fifth switch unit T5 are both connected to the third scan signal line Scan[3].

The third switch unit T3 is connected between the data voltage Vdata and the first terminal a of the energy storage unit C1, the sixth switch unit T6 is connected between the output terminal of the pixel driving unit DT1 and the electroluminescent element L, and control terminals of the third switch unit T3 and the sixth switch unit T6 are both connected to the first scan signal line Scan[1].

One terminal of the fourth switch unit T4 is connected to the second terminal b of the energy storage unit C1, the other terminal of the fourth switch unit T4 is grounded and a control terminal of the fourth switch unit T4 is connected to the second scan signal line Scan[2].

A control terminal of the pixel driving unit DT1 is further connected to the second terminal b of the energy storage unit C1.

In the alternative embodiment of the present disclosure, the operation current flowing through the electroluminescent element is not affected by the threshold voltage of the corresponding driving transistor, and the problem of display brightness nonuniformity due to a drift of the threshold voltage of the driving transistor is completely solved.

Further, the energy storage unit C1 is a capacitor. Of course, in practical use, other elements with the energy storage function may be adopted depending on the design requirement.

Further, as shown in FIG. 2a, the output sub module 320 comprises a seventh switch unit T7. One terminal of the seventh switch unit T7 is connected to the touch signal read line (the Y-read Line), the other terminal of the seventh switch unit T7 is connected to the detection sub module 320 and a control terminal of the seventh switch unit T7 is connected to the third scan signal line Scan[3].

Further, the detection sub module 310 comprises an eighth switch unit T8, a touch signal driving unit DT2, a sensing capacitor C2 and a touch electrode d. The eighth switch unit T8 is connected between a control terminal of the touch signal driving unit DT2 and the data voltage Vdata, a control terminal of the eighth switch unit T8 is connected to the second scan signal line Scan[2]; an input terminal of the touch signal driving unit DT2 is connected to the second operation voltage Vint and an output terminal of the touch signal driving unit DT2 is connected to the seventh switch unit T7; the sensing capacitor C2 is connected between the input terminal and the control terminal of the touch signal driving unit DT2, and the touch electrode d is connected to the control terminal of the DT2. Meanwhile, since the control terminal of the DT2 is connected to one terminal of the C2, the touch electrode d is also connected to the capacitor C2 which functions for maintaining the voltage of the touch electrode d.

With the detection sub module having such structure, a value of a sensing capacitor will be formed between the user's finger or other touch object and the touch electrode to which the sensing capacitor is connected, when the user is performing a touch operation. The detection of the touch location may be realized accurately by measuring the location of the sensing capacitor.

Further, the respective switch units and the driving units are thin film transistors (TFTs).

Further, as shown in FIGS. 2a-2c, the respective thin film transistors are P-channel type transistors, the control terminals of the driving units are gates of the TFTs, the input terminals of the driving units are sources of the TFTs and the output terminals are drains of the TFTs; the control terminals of the respective switch units are gates of the TFTs and the other two terminals correspond to sources and drains of the TFTs.

The process flow can be unified by using transistors of the same type, so that the yield of the products is improved.

Those skilled in the art may understand that in practical use, the types of the respective transistors may not be the same. For example, T2 and T5 may be N-channel type transistors, while T3 and T6 may be P-channel type transistors. As long as the on/off states of two switch units whose control terminals are connected to the same scan signal line are the same, the technical solution provided in the present application may be realized. The implementations described in the present disclosure shall not be interpreted as a limitation to the protection scope of the present disclosure.

Further, referring to FIG. 2b, the third scan signal line Scan[3] to which the output sub module 320 is connected may be replaced with the first scan signal line Scan[1], and accordingly, the third scan signal line Scan[3] to which the control terminal of the seventh switch unit T7 is connected is replaced with the first scan signal line Scan[1].

Further, referring to FIG. 2c, on the basis of the pixel circuit provided in FIG. 2b, the second scan signal line Scan[2] to which the control terminal of the detection sub module 310 is connected is replaced with the third scan signal line Scan[3], and accordingly, the second scan signal line Scan[2] to which the control terminal of the eighth switch unit T8 is connected is replaced with the third scan signal line Scan[3].

Figure 3:
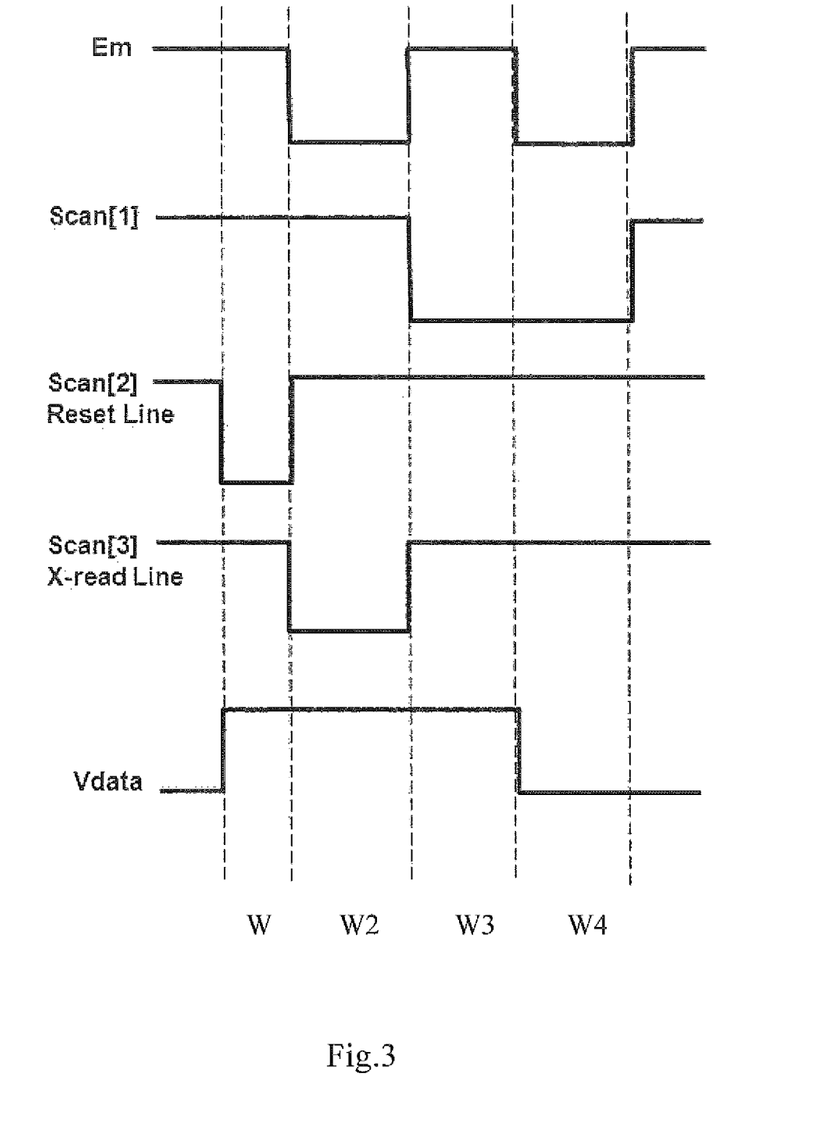

Hereinafter, the operation principle of the pixel circuit in FIG. 2a will be described with reference to FIGS. 3 and 4. For convenience of the description, assume that the respective switch units and the driving units are P-channel type TFT, and the energy storage unit is the capacitor. FIG. 3 is a possible time sequence diagram for the scan signals of the respective scan signal lines and the data voltage Vdata in one frame when the pixel circuit in FIG. 2a is in operation, which may be divided into four phases represented as a first phase W1, a second phase W2, a third phase W3 and a fourth phase W4 in FIG.3 respectively. FIGS. 4a-4d are schematic diagrams of the current flow directions and the voltage values of the pixel circuit in FIG. 2a in different timings. In the above phases W1-W4, the current flow directions and the voltage values of the pixel circuit are as shown in FIGS. 4a, 4b, 4c and 4d, respectively.

Figure 4A:
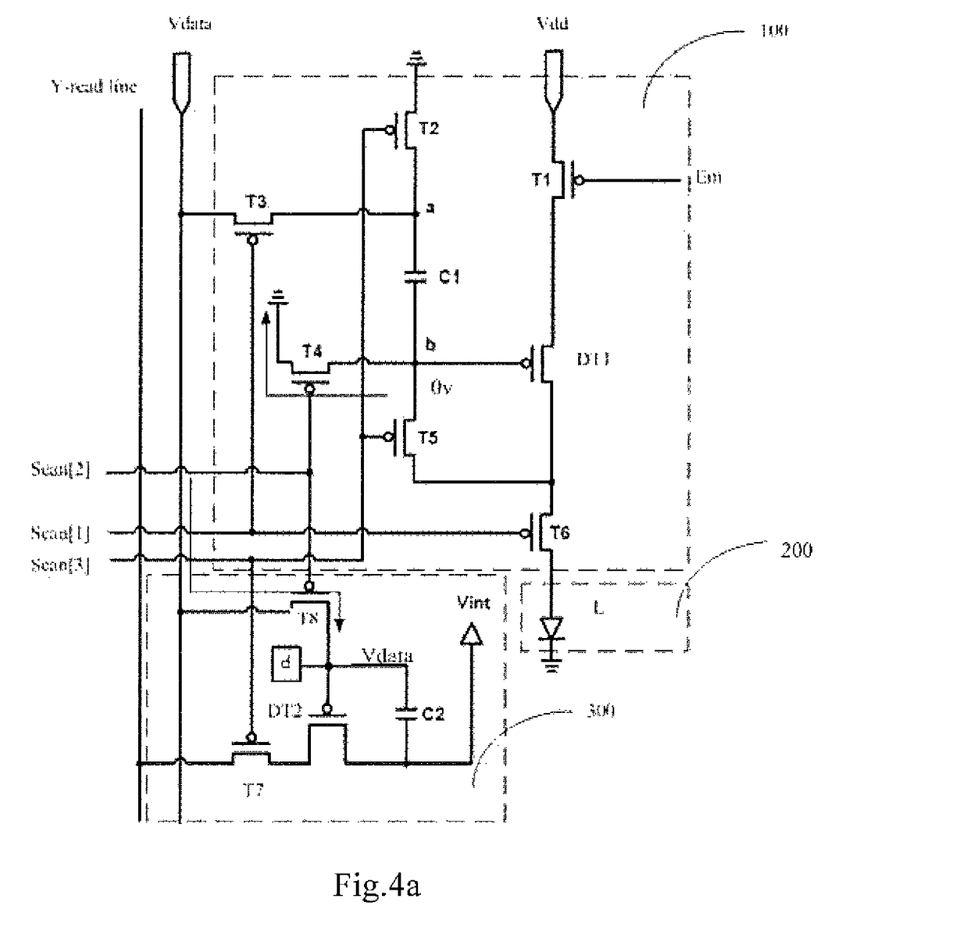

In the first phase W1, referring to FIG. 3, at this time Scan[2] is at a low voltage level, and the other scan signal lines and the data voltage Vdata are at a high voltage levels. Referring to FIG. 4a, in the pixel compensation module 100, only T4 is turned on. At this time, the point b is reset to be grounded with a potential of 0V, resetting the voltage signal of the previous frame in the capacitor C1. In the touch detection module 300, T8 is turned on, and T7 and DT2 are turned off, realizing the reset of the touch detection module. The potential at point d after the reset is equal to the potential at Vdata. It can be seen that Scan[2] is equivalent to the reset scan signal line (Reset line) of the pixel compensation module 100 and the touch detection module 300.

Figure 4B:
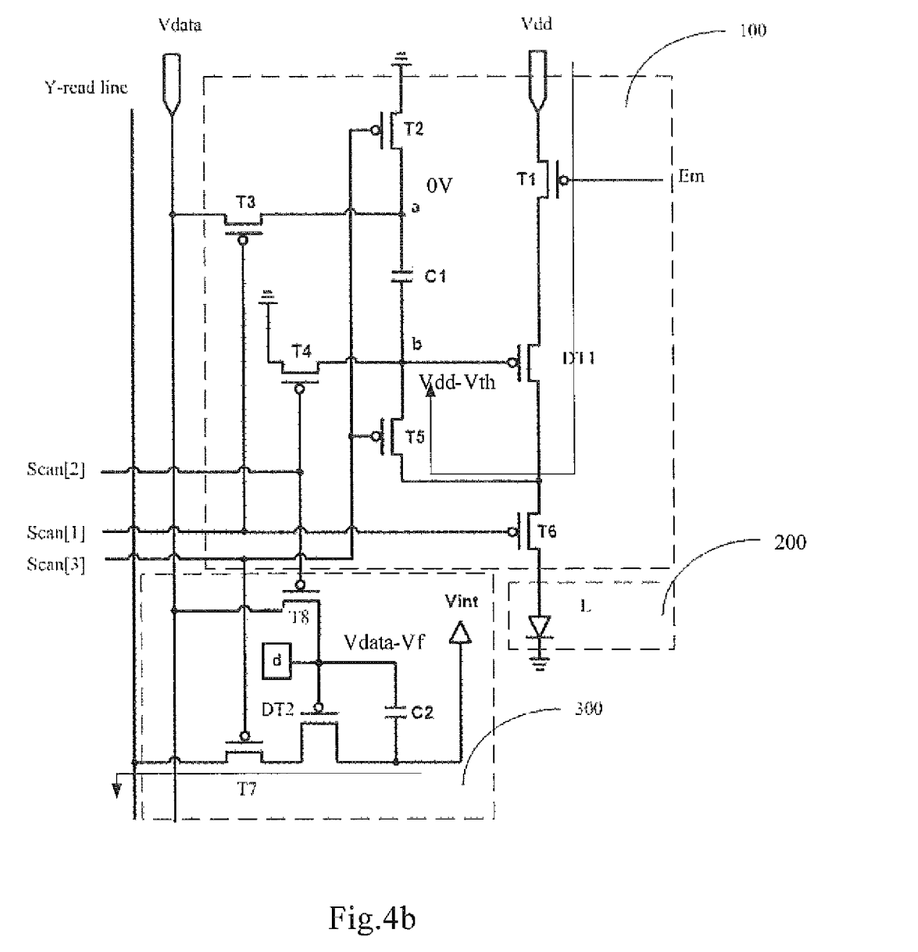

In the second phase W2, referring to FIG. 3, at this time, Em and Scan[3] are at low voltage levels, and the other scan signal lines and the data voltage Vdata are at high voltage levels. Referring to FIG. 4b, in the pixel compensation module 100, T1, T2 and T5 are turned on, T3, T4 and T6 are turned off. Since the point b is grounded previously, the pixel driving unit DT1 is turned on. The Vdd signal begins to charge to the point b along T1→DT1→T5, until the point b is charged to Vdd−Vth (satisfying that the voltage difference between the gate and the source of the DT1 is Vth, wherein Vth is the threshold voltage of DT1). In this process, since the point a is grounded with its potential being 0 all the time, the potential of point b will always be kept at Vdd−Vth after the charging is completed. Further, the current won't flow through the OLED due to T6 being turned off, which decreases the lifetime loss of the OLED indirectly.

In the touch detection module 300, referring to FIG. 4b, T8 is turned off, and T7 is turned on. At this time, in this phase, the coupling pulse signal (Vint) provides the potential at one terminal of C2 to form a coupling capacitor on one hand, and functions as the source of DT2 (DT2 being equivalent to an amplifying TFT at this time) on the other hand. A touch by finger will cause the gate potential of DT2 to be decreased directly (assuming decreased by Vf). When the gate-source voltage of DT2 satisfies the turning-on condition of the MOS transistor, a signal will pass through DT2, at this time it is a buffering phase of the touch unit, in which it waits for the gate potential of DT2 to be decreased, and the main reason for the decrease is the touch by finger.

At this time, if there is a touch by finger, the potential at point d will be decreased directly, satisfying the turning-on condition of DT2. At this time, the I&V characteristic curve is in the amplifying region, DT2 as the amplifying TFT will turn on and amplify the coupling pulse signal, and the Y direction signal will be captured by the Y-Read line. Scan[3] as a horizontal scan signal (in X direction) also has a capturing function (Since the signal in the Y direction can be captured only at a timing when Scan[3] is at a low voltage level, and Scan[3] in a specific pixel at a specific timing is a low voltage level signal, the X coordinate may be determined according to the timing of the captured Y direction signal). In this way, the X coordinate and the Y coordinate of the location where the finger touches are determined. In this process, the location coordinates may be captured at any time as long as the finger is in touch.

It can be seen that in the embodiment of the present disclosure, Scan[3] functions as the touch signal read line (X-read line) in the X direction (the X direction corresponding to the scan direction).

Figure 4C:
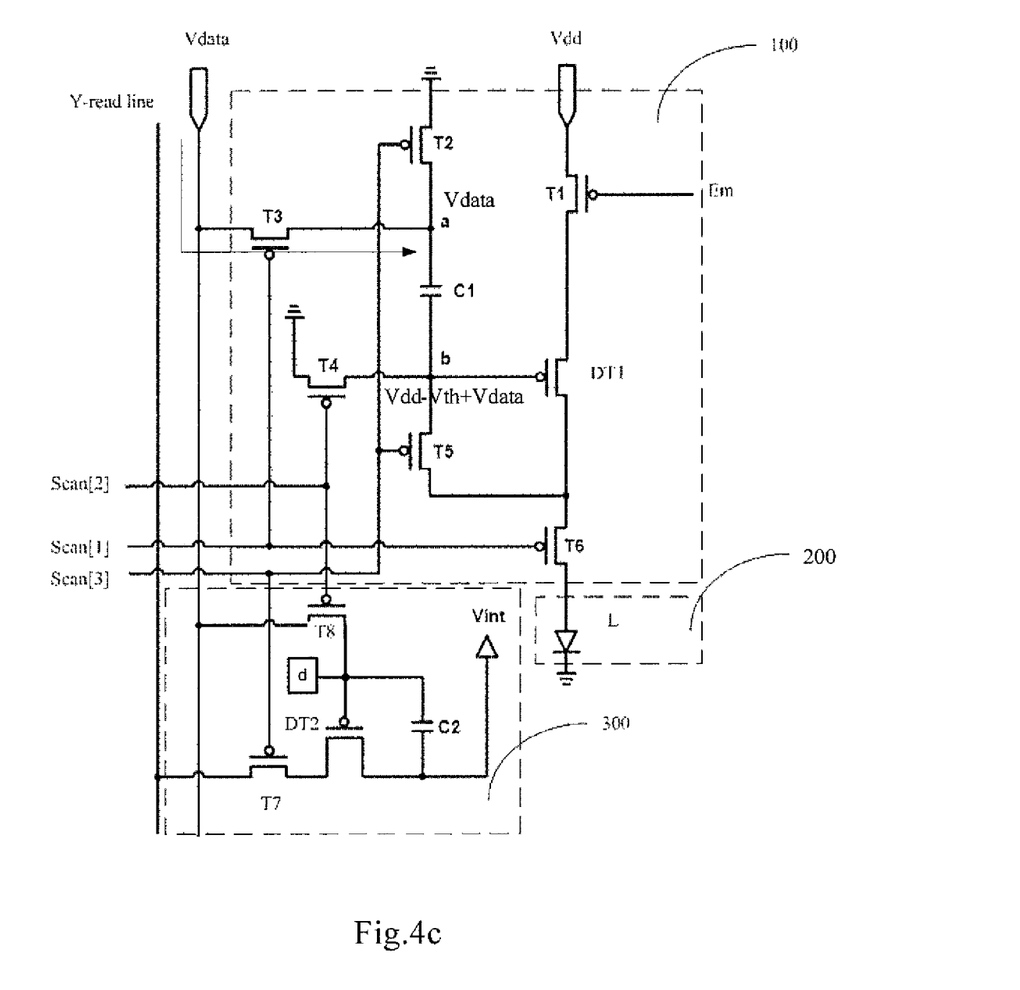

In the third phase W3, as shown in FIG. 3, only Scan[1] is at a low voltage level, and the other scan signal lines and the data voltage Vdata are at high voltage levels. As shown in FIG. 4c, in the pixel compensation module 100, at this time, T3 and T6 are turned on and the other TFTs are turned off. At this time, the potential at point a has changed to Vdata from the original 0V, and the point b is in the floating state. Therefore, in order to maintain the original voltage difference (Vdd−Vth) between the points a and b, the potential at point b as the gate of DT1 will jump by the same change, i.e., the potential at point b jumps to be Vdd−Vth+vdata and is fixed unchanged to prepare for the next phase.

In the touch detection module 300, all TFTs are turned off. The touch detection module 300 is in a suspended state, which may alleviate the impact on the display process.

Figure 4D:
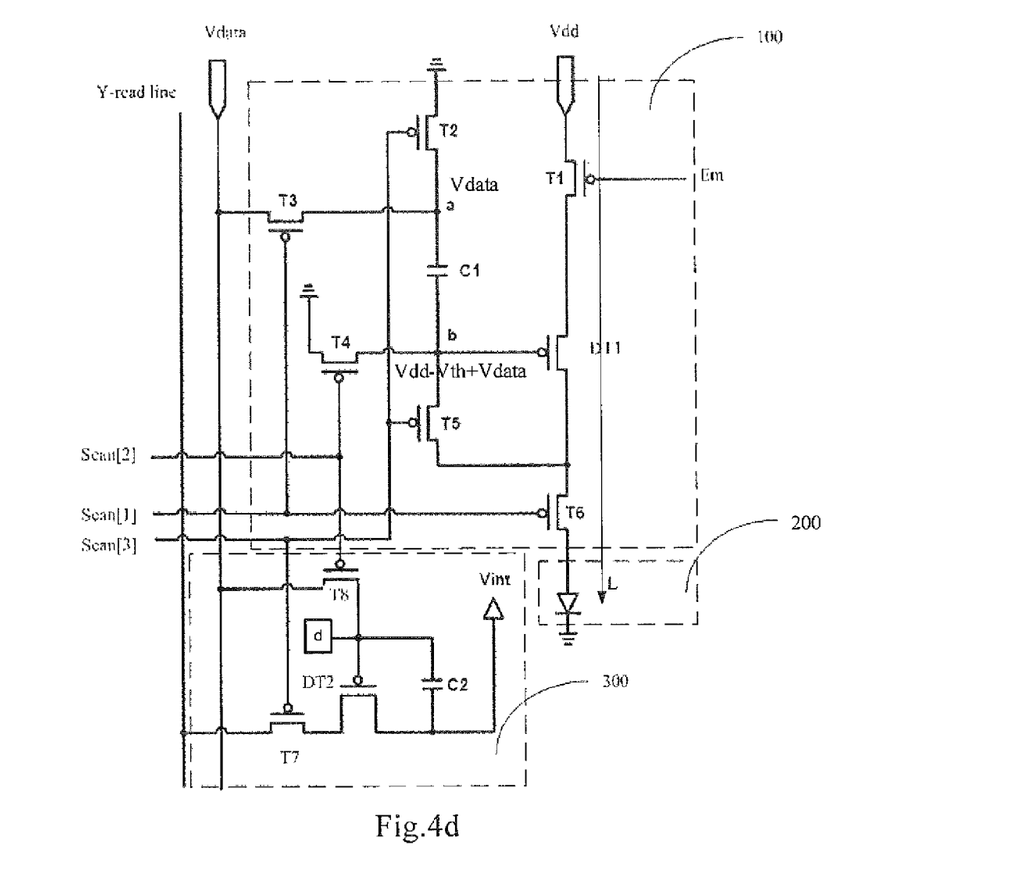

In the fourth phase W4, as shown in FIG. 3, only Scan[1] and Em are at low voltage levels, and the other scan signal lines are at high voltage levels. As shown in FIG. 4d, in the pixel compensation module 100, at this time, T1, T3 and T6 are turned on, and the other switch TFTs are turned off. Vdd is passed along T1→DT1→T6 to make the OLED emit light.

In the touch detection module 300, all the TFTs are still turned off, and the touch detection module 300 is in the suspended state, which may alleviate the impact on the display process.

Therefore, the current flowing through the pixel driving unit DT1 may be derived from the current characteristic of the TFT in the saturated region as follows:

$$IOLED = K(V_{GS} - V_{th})^2 = K[Vdd - (Vdd - Vth + Vdata) - Vth]^2 = K(Vdata)^2$$

It may be seen from the above expression that the operation current IOLED is not affected by Vth at this time, and is only related to Vdata. The problem of the drift of the threshold voltage (Vth) of the driving TFT due to the manufacture process and longtime operation is solved completely, the impact thereof on the IOLED is eliminated and the normal operation of OLED is assured.

The operation principles of the pixel circuits provided in FIGS. 2b and 2c are consistent with that of the pixel circuits provided in FIG. 2a. The difference lies in that, in the pixel circuit in FIG. 2b or FIG. 2c, the touch signal can only be detected when Scan[1] is at a low voltage level (i.e., in the third phase W3 and the fourth phase W4), at that time Scan[1] is equivalent to the X-read line. In addition, in the pixel circuit as shown in FIG. 2c, the reset of the touch detection module 300 can only be achieved when Scan[3] is at a low voltage level, at that time Scan[3] replaces Scan[2] as the Reset line.

The present disclosure also provides a display apparatus comprising pixel circuits of any one described above.

Here, the display apparatus may be any product or component with a display function, such as an electronic paper, a mobile phone, a tablet, a TV, a display, a notebook computer, a digital frame, a navigation instrument or the like.

Figure 5:
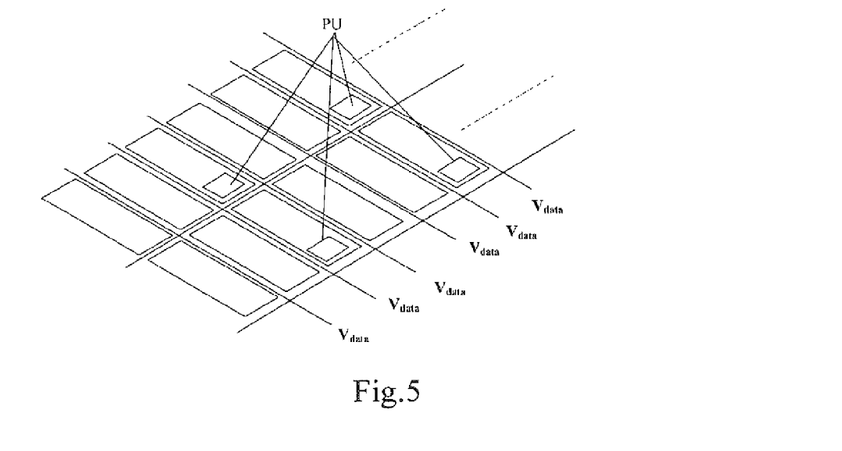
FIG. 5 is a schematic diagram showing a positional relationship between the pixel circuit and the pixel in a display apparatus provided in an embodiment of the present disclosure.

Alternatively, the pixel circuit is distributed periodically in the display apparatus. In practical use, it is not necessary for all the positions corresponding to respective pixels to each adopt the pixel circuit provided by embodiments of the present disclosure (for example, among three pixels, one is provided with the pixel circuit provided by embodiments of the present disclosure, and the other pixels are provided with normal pixel circuits), the detection of the touch signal can be realized as well. FIG. 5 shows a case in which one pixel circuit (PU) provided by embodiments of the present disclosure is arranged in every three pixels.

What described above are only alternative implementations of the present disclosure. It should be noted that, to those of ordinary skill in the art, several improvements and modifications may be made without departing from the technical principle of the present disclosure, and such improvements and modifications shall also fall within the protection scope of the present disclosure.

The present application claims the priority of a Chinese patent application No. 201410225975.4 filed on May 26, 2014, entire content of which is incorporated as part of the present invention by reference.

What is claimed is:

1. A pixel circuit comprising a pixel compensation module, a light emitting module and a touch detection module, wherein
    the pixel compensation module is connected to a first to a fourth scan signal lines, a first operation voltage, a data voltage and the light emitting module respectively, and is configured to control the light emitting module to emit light for display in accordance with inputs from the scan signal lines;
    the touch detection module comprises a detection sub module and an output sub module, the detection sub module is connected to the second scan signal line, a second operation voltage and the data voltage respectively, and is configured to detect a touch signal; the output sub module is connected to the third scan signal line, a touch signal read line and the detection sub module, and is configured to output a touch detection signal to the touch signal read line in accordance with an input from the third scan signal line;

wherein the second operation voltage is used to provide a driving pulse;

wherein the light emitting module comprises an electroluminescent element connected to the pixel compensation module;

wherein the pixel compensation module comprises a first to a sixth switch units, a pixel driving unit and an energy storage unit; and wherein the first switch unit is connected between the first operation voltage and an input terminal of the pixel driving unit, a control terminal of the first switch unit is connected to the fourth scan signal line;

the second switch unit is connected to the energy storage unit and the fifth switch unit in cascade sequentially, wherein one terminal of the second switch unit is grounded and the other terminal of the second switch unit is connected to a first terminal of the energy storage unit; one terminal of the fifth switch unit is connected to a second terminal of the energy storage unit and the other terminal of the fifth switch unit is connected to an output terminal of the pixel driving unit, and control terminals of the second switch unit and the fifth switch units are both connected to the third scan signal line;

the third switch unit is connected between the first terminal of the energy storage unit and the data voltage, the sixth switch unit is connected between the output terminal of the pixel driving unit and the electroluminescent element, and control terminals of the third switch unit and the sixth switch unit are both connected to the first scan signal line;

one terminal of the fourth switch unit is connected to the second terminal of the energy storage unit, the other terminal of the fourth switch unit is grounded, and a control terminal of the fourth switch unit is connected to the second scan signal line; and a control terminal of the pixel driving unit is further connected to the second terminal of the energy storage unit.

2. A display apparatus comprising pixel circuits of claim 1.

3. The pixel circuit of claim 1, wherein the respective switch units and the driving units are thin film transistors (TFTs).

4. The pixel circuit of claim 3, wherein the respective thin film transistors are P-channel type transistors, the control terminals of the driving units are gates of the TFTs, the input terminals of the driving units are sources of the TFTs and output terminals of the driving units are drains of the TFTs; the control terminals of the respective switch units are gates of the TFTs and the other two terminals of the respective switch units correspond to sources and drains of the TFTs.

5. The pixel circuit of claim 1, wherein the output sub module comprises a seventh switch unit, one terminal of the seventh switch unit is connected to the touch signal read line, the other terminal of the seventh switch unit is connected to the detection sub module, and a control terminal of the seventh switch unit is connected to the third scan signal line.

6. The pixel circuit of claim 5, wherein the detection sub module comprises an eighth switch unit, a touch signal driving unit, a sensing capacitor and a touch electrode, and wherein the eighth switch unit is connected between a control terminal of the touch signal driving unit and the data voltage, a control terminal of the eighth switch unit is connected to the second scan signal line; an input terminal of the touch signal driving unit is connected to the second operation voltage and an output terminal of the touch signal driving unit is connected to the seventh switch unit; the sensing capacitor is connected between the input terminal and the control terminal of the touch signal driving unit, and the touch electrode is connected to the control terminal of the touch signal driving unit.

7. The pixel circuit of claim 6, wherein the third scan signal line to which the output sub module is connected is replaced with the first scan signal line, and the third scan signal line to which the control terminal of the seventh switch unit is connected is replaced with the first scan signal line.

8. The pixel circuit of claim 7, wherein the second scan signal line to which a control terminal of the detection sub module is connected is replaced with the third scan signal line, and the second scan signal line to which the control terminal of the eighth switch unit is connected is replaced with the third scan signal line.

9. The pixel circuit of claim 6, wherein the respective switch units and the driving units are thin film transistors (TFTs).

10. The pixel circuit of claim 5, wherein the respective switch units and the driving units are thin film transistors (TFTs).

11. The pixel circuit of claim 5, wherein the third scan signal line to which the output sub module is connected is replaced with the first scan signal line, and the third scan signal line to which the control terminal of the seventh switch unit is connected is replaced with the first scan signal line.

12. The pixel circuit of claim 11, wherein the second scan signal line to which a control terminal of the detection sub module is connected is replaced with the third scan signal line, and the second scan signal line to which the control terminal of the eighth switch unit is connected is replaced with the third scan signal line.

13. The pixel circuit of claim 1, wherein the energy storage unit is a capacitor.

14. The pixel circuit of claim 13, wherein the respective switch units and the driving units are thin film transistors (TFTs).

15. The pixel circuit of claim 13, wherein the output sub module comprises a seventh switch unit, one terminal of the seventh switch unit is connected to the touch signal read line, the other terminal of the seventh switch unit is connected to the detection sub module, and a control terminal of the seventh switch unit is connected to the third scan signal line.

16. The pixel circuit of claim 15, wherein the detection sub module comprises an eighth switch unit, a touch signal driving unit, a sensing capacitor and a touch electrode, and wherein the eighth switch unit is connected between a control terminal of the touch signal driving unit and the data voltage, a control terminal of the eighth switch unit is connected to the second scan signal line; an input terminal of the touch signal driving unit is connected to the second operation voltage and an output terminal of the touch signal driving unit is connected to the seventh switch unit; the sensing capacitor is connected between the input terminal and the control terminal of the touch signal driving unit, and the touch electrode is connected to the control terminal of the touch signal driving unit.

17. The pixel circuit of claim 16, wherein the third scan signal line to which the output sub module is connected is replaced with the first scan signal line, and the third scan signal line to which the control terminal of the seventh switch unit is connected is replaced with the first scan signal line.

18. The pixel circuit of claim 15, wherein the third scan signal line to which the output sub module is connected is replaced with the first scan signal line, and the third scan signal line to which the control terminal of the seventh switch unit is connected is replaced with the first scan signal line.

* * * * *